United States Patent
Mahan et al.

(10) Patent No.: US 6,468,885 B1
(45) Date of Patent: Oct. 22, 2002

(54) DEPOSITION OF DEVICE QUALITY, LOW HYDROGEN CONTENT, HYDROGENATED AMORPHOUS SILICON AT HIGH DEPOSITION RATES

(75) Inventors: Archie Harvin Mahan, Golden, CO (US); Edith C. Molenbroek, Rotterdam (NL); Alan C. Gallagher, Louisville, CO (US); Brent P. Nelson, Golden, CO (US); Eugene Iwaniczko, Lafayette, CO (US); Yueqin Xu, Golden, CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 09/669,248

(22) Filed: Sep. 25, 2000

Related U.S. Application Data (63) Continuation-in-part of application No. 09/066,276, filed on Apr. 24, 1998, now Pat. No. 6,124,186, which is a continuation of application No. 08/755,947, filed on Nov. 25, 1996, now abandoned, which is a continuation-in-part of application No. 08/721,080, filed on Sep. 26, 1996, now abandoned.

(51) Int. Cl.$^7$ ............................................... H01L 21/76

(52) U.S. Cl. ............................ 438/482; 438/485

(58) Field of Search ............................... 438/482, 483, 438/485

(56) References Cited

U.S. PATENT DOCUMENTS

| | | | | |
|---|---|---|---|---|
| 5,397,737 A | * | 3/1995 | Mahan et al. | 438/482 |
| 6,069,094 A | * | 5/2000 | Matsumara et al. | 438/788 |
| 6,124,186 A | * | 9/2000 | Molenbroek et al. | 148/DIG. 1 |
| 6,214,706 B1 | * | 4/2001 | Madan et al. | 438/482 |

* cited by examiner

*Primary Examiner*—Olik Chaudhuri
*Assistant Examiner*—Erik Kielin
(74) *Attorney, Agent, or Firm*—Paul J. White (57) ABSTRACT

A method of fabricating device quality, thin-film a-Si:H for use as semiconductor material in photovoltaic and other devices, comprising in any order; positioning a substrate in a vacuum chamber adjacent a plurality of heatable filaments with a spacing distance L between the substrate and the filaments; heating the filaments to a temperature that is high enough to obtain complete decomposition of silicohydride molecules that impinge said filaments into Si and H atomic species; providing a flow of silicohydride gas, or a mixture of silicohydride gas containing Si and H, in said vacuum chamber while maintaining a pressure P of said gas in said chamber, which, in combination with said spacing distance L, provides a P×L product in a range of 10–300 mT-cm to ensure that most of the Si atomic species react with silicohydride molecules in the gas before reaching the substrate, to thereby grow a a-Si:H film at a rate of at least 50 Å/sec.; and maintaining the substrate at a temperature that balances out-diffusion of H from the growing a-Si:H film with time needed for radical species containing Si and H to migrate to preferred bonding sites.

4 Claims, 7 Drawing Sheets

DEPOSITION OF DEVICE QUALITY, LOW HYDROGEN CONTENT, HYDROGENATED AMORPHOUS SILICON AT HIGH DEPOSITION RATES

CROSS-REFERENCE TO RELATED PATENT APPLICATIONS

This patent application is a continuation-in-part of U.S. patent application Ser. No. 09/066,276, filed on Apr. 24, 1998 now U.S. Pat. No. 6,124,186, which is a continuation of U.S. patent application Ser. No. 08/755,947, filed on Nov. 25, 1996 now abandoned, which is a continuation-in-part of U.S. patent application Ser. No. 08/721,080, filed on Sep. 26, 1996 now abandoned.

CONTRACTUAL ORIGIN OF THE INVENTION

The United States Government has rights in this invention under Contract No. DE-AC36-99GO10337 between the U.S. Department of Energy and the National Renewable Energy Laboratory, a Division of Midwest Research Institute.

BACKGROUND OF THE INVENTION

1. Field of the Invention

The present invention relates to the deposition of thin films of material on a substrate, and more specifically to the high-rate deposition of device quality hydrogenated amorphous silicon (a-Si:H) by the hot wire technique for use as photovoltaic and other semiconducting devices.

2. Description of the Prior Art

In the manufacture and construction of microelectronic semiconductor devices and photovoltaic solar cells, amorphous silicon is a feasible alternative to the use of silicon crystals for layers of a device, due to economics, flexibility in manufacture, and higher through-put. However, unalloyed amorphous silicon has a very high density of midgap (defect) states, and, as a consequence, has very poor electrical properties. Most of these midgap defect states can be passivated by the incorporation of hydrogen into the amorphous silicon layer, which is usually accomplished during the deposition process, and it considerably improves the electrical properties of the individual layers and the device.

Two measures of these electrical properties of hydrogenated amorphous silicon layers are the Urbach tail width and the density of midgap states, both of which should be minimized to achieve device quality semiconductor films. Although exact mechanisms are not known, there is a relationship in glow discharge (GD) deposited films between the amount of hydrogen incorporated and both the Urbach tail width and density of midgap states. At hydrogen concentrations too low, the amorphous silicon film exhibits very poor electrical properties due to the high density of midgap states and is thus not suitable for use in practical devices. At hydrogen concentrations too high, these films show an increased density of microvoids and once again inferior electrical properties.

A pervasive problem when hydrogenated amorphous silicon is used in photovoltaic solar cells has been that these solar cells tend to degrade electrically over time upon exposure to sunlight. This degradation, which is referred to as the Staebler-Wronksi effect, has been linked to the concentration of hydrogen within the amorphous silicon film. The prevalent model for the Staebler-Wronksi effect has suggested that the degradation is due to movement of hydrogen within the film. Therefore, until recently, hydrogen content in the range of 10–15 at. % was considered to be an optimum balance, i.e., not so low as to cause inferior electrical device qualities and not so high as to be subject to excessive Staebler-Wronski degradation upon exposure to sunlight.

In the last decade or so, since the development of the glow discharge (GD) technique as the standard means for producing device quality hydrogenated amorphous silicon (a-Si:H) films for solar cells and other applications, there has been considerable progress made in increasing the efficiencies of these solar cells. However, most of this progress has been in improved techniques in manufacturing and design of these multi-layer solar cells, and not improvements in the electrical quality of the a-Si:H layer. Examples of such improvements include better uniformity of deposition, better light capture, and better doping of layers. The U.S. Pat. No. 4,237,150, issued to H. Weismann, and the U.S. Pat. No. 4,237,151, issued to Strongin et al. illustrate attempts to improve amorphous silicon as a photovoltaic material by using silane as a silicon source gas in a hot wire deposition technique to eliminate impurities, non-uniformities, and clusters of silicon that they thought limited the utility of the material. J. Doyle et al., in their article, Production of High Quality Amorphous Silicon Films by Evaporative Silane Surface Decomposition, published in the Journal of Applied Physics, Vol. 64, p. 3215–3223, 1988, gave credit to H. Weismann and carried the improvements to better temperature and vacuum ranges, but they apparently were not able to control the degradation from the Staebler-Wronski effect. No improvements beyond that available using glow discharge (GD), either in the material quality or in the Staebler-Wronski effect, were achieved by using the deposition methods that were reported in those publications.

The U.S. Pat. No. 5,397,737 issued to Mahan et al., which is incorporated herein by reference, shows that by keeping four deposition parameters in the hot wire technique—filament temperature, silane pressure, distance between filament and substrate, and substrate temperature—all within certain specified ranges, hydrogenated amorphous silicon (a-Si:H) films with hydrogen content as low as 1 at. % can be produced that still have device quality electrical properties. Such low hydrogen content, device quality films were also shown to have substantially less Staebler-Wronski degradation when exposed to sun light than the previous state-of-the-art, device quality hydrogenated amorphous silicon (a-Si:H) films with 10–15 at. % hydrogen content.

The improvements described above, as well as many other improvements made in device quality hydrogenated amorphous silicon (a-Si:H) films, have advanced the state-of-the-art in electrical quality. However, to maintain such electrical device quality, the deposition rates of the hydrogenated amorphous silicon films have had to remain quite low. For example, the deposition rate for the low hydrogen content, device quality hydrogenated amorphous silicon (a-Si:H) film produced according to the U.S. Pat. No. 5,397,737 discussed above, is in the range of about 5–20 Å/sec. In general, past experiences in this field have indicated that as deposition rates are increased, the electrical qualities of the resulting hydrogenated amorphous silicon film devices decrease. To maintain device quality, current industrial GD production of hydrogenated amorphous silicon cells is done at deposition rates of 1–2 Å/sec. One reason for using such low deposition rate is believed to be that, as the deposition rate increases, the rate of arrival and incorporation of hydrogen atoms into the a-Si:H compound is faster than the out-diffusion of hydrogen atoms that accompanies Si—Si bonding. In addition, beyond a certain hydrogen content in terms of atomic percent (at. %), this excess hydrogen bonds differently. Instead of monohydride silicon bonds (SiH), which provide effective defect passivation and have good electrical qualities and stability, polyhydride bonds $(SiH_2)_n$ begin to form, which are less desirable and remain in the film. Also, at higher deposition rates, hydrogen that does not out-diffuse does not have time to diffuse to preferred sites, thereby forming a dense silicon network. Therefore, the presence of polyhydrides $(SiH_2)_n$ result in less dense films with more microvoids, inferior electrical properties, poorer solar cell performance, and greater Staebler-Wronski effect degradation.

There would be significant advantages for higher deposition rates of hydrogenated amorphous silicon (a-Si:H) films, provided that the resulting films have device quality electrical characteristics and minimal Staebler-Wronski effect degradation upon exposure to sun light. In particular, deposition of the intrinsic (i) layer of device, which is commonly ten to twenty times thicker than the p-layer and the n-layer, could be accomplished with much less dwell time in the deposition chamber than is now required at current low deposition rates, thus allowing for higher through-put in manufacturing lines.

There are reports of attempts to achieve higher rate depositions of hydrogenated amorphous silicon films. For example: The Neuchatel Laboratory reported a VHF (very high frequency) glow discharge plasma deposition process in which frequencies varied from 13.56 MHz to 100 Mhz to achieve deposition rates up to 20 Å/sec, F. Finger et al., MRS Symp. Pro., vol. 192, page 583 (1990); The Electrotechnical Laboratory has used an rf (radio frequency) deposition system in a chemical vapor deposition (with higher discharge powers and higher substrate temperatures) that deposited films at about 10 Å/sec, G. Ganguly et al., Phys. Rev. B., vol.47, page 3661 (1993); and United Solar Systems Corp. has used a microwave deposition and higher substrate temperature to achieve up to 100 Å/sec, S. Guha et al., APL, vol. 66, page 595 (1995). However, hydrogenated amorphous silicon films produced by such high deposition rate techniques have not shown sufficient promise with regard to a combination of improved material properties and a reduced Staebler-Wronski degradation to warrant serious consideration for incorporation into industrial manufacturing processes.

SUMMARY OF THE INVENTION

Accordingly, an object of the present invention is to provide a high deposition rate process for producing hydrogenated amorphous silicon film which has state-of-the-art or better electrical device quality of the intrinsic or undoped material.

Another object of the present invention is to provide a viable, economical, and high through-put method of depositing hydrogenated amorphous silicon films for solar cells and other applications, which films demonstrate significantly improved electrical, chemical, and structural qualities that meet specifications for use as commercial solar cell devices.

Additional objects, advantages, and novel features of the invention shall be set forth in part in the description that follows, and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purpose of the present invention, as embodied and broadly described herein, the method of this invention may comprise producing a thin film of hydrogenated amorphous silicon by flowing a silicohydride gas past a filament which has been heated to a sufficient temperature to thermally decompose the silicohydride on the filament into mostly, atomic silicon and atomic hydrogen. The filament should be heated to at least 1500° C., but is preferably heated to about 2,000° C. This gaseous mixture of mostly atomic silicon and atomic hydrogen is then evaporated from the filament and products of reactions of the silicon and hydrogen atoms with silicohydride gas molecules are deposited onto a substrate heated to between 200° and 600° C., but which is preferably heated to about 425° C. (actual substrate surface temperature) for concentrated silane. This procedure of thermally decomposing the silicohydride on the heated filament, allowing the atomic Si and H to react with the silicohydride gas, and then depositing these reaction products onto a heated substrate occurs within a deposition chamber maintained at an optimum multiplication product of pressure (P) times filament-substrate spacing (L) in the range of about 10–300 millitorr-cm, preferably about 20 to 200 millitorr-cm for concentrated silane, and with the substrate positioned within a range of about 0.5–3.0 cm, preferably about 1.5 cm, from the filament. A further improvement over a single filament, both in terms of increased deposition rate and film uniformity over a large substrate area, is to use an array of a plurality of filaments, each of which is positioned L distance from the substrate as well as being spaced by a distance approximately equal to L apart from each other. In this case, L can be in the range from 0.5–5.0 cm and preferably about 3.0 cm.

The silicohydride gas may be silane, disilane, or other gases or combinations of gases containing silicon and hydrogen. The heated filaments are preferably made from tungsten, but can be made from other high temperature materials such as tantalum, graphite, or silicon carbide so long as the filament temperature is adjusted to decompose the silicohydride gas and release H atoms efficiently. When the silicohydride gas is decomposed at those temperature and pressure ranges described above, the hydrogen content of the film appears to be controlled by the temperature of the substrate and the deposition rate, such that the higher the temperature or the lower the deposition rate, the lower the hydrogen content. Despite high deposition rates of about 100 Å/sec when using multiple filaments (nominally in the range of 50–150 Å/sec), films produced at high substrate temperatures ($T_s$) with concentrated silane in the process of this invention still exhibit photovoltaic device quality electrical, chemical, and mechanical properties which do not degrade as readily upon exposure to sunlight, even though the hydrogen content of the resulting hydrogenated amorphous silicon film is about 6–8 at. %. When using other silicohydride gases or mixtures of these gases, the P×L ranges described above should be adjusted to achieve equivalent probability of gas reaction with Si and H atoms from the gas decomposition that occurs at the filament.

BRIEF DESCRIPTION OF THE DRAWINGS

The accompanying drawings, which are incorporated herein and form a part of the specification illustrate preferred embodiments of the present invention, and together with the description, serve to explain the principles of the invention. In the drawings.

A listing of the deposition parameters used in samples at increasing deposition rates, according to this invention are shown in Table I. In this regard, each substrate temperature listed in Table I ($T_{sub}$) represents the value measured at the start of the respective deposition. Radiation from the filament or filaments provide an additional source of heat to the growing film, so the actual average substrate temperature $T_{sub}$ of a sample during deposition is a complicated function of filament to substrate distance and filament temperature as well as film deposition rate and film thickness (total exposure time of the substrate to the heated filament). A filament current of 15 amps, as listed in Table I, corresponds to a filament temperature of approximately 2000° C..

DETAILED DESCRIPTION OF THE PREFERRED EMBODIMENTS

A device quality hydrogenated amorphous silicon (a-Si:H) film is produced at high rates of about 50–150 Å/sec or more by the high temperature decomposition of a gas containing silicon and hydrogen, under a vacuum, by depositing the products of silicohydride gas reactions with silicon and hydrogen from decomposed silicohydride gas onto a heated substrate. Heretofore it has been believed that to achieve a device quality hydrogenated amorphous silicon film, as determined by measuring such parameters as Urbach Tail widths, Tauc's Bandgap, Photo-conductivity, and Dark Conductivity, that the film had to contain at least between 10 and 15 atomic percent (at. %) hydrogen and be produced at low rates of less than about 10 Å/sec and preferably as low as about 1–2 Å/sec. However, the hydrogenated amorphous silicon (a-Si:H) films produced from concentrated silane according to the principles and method of the present invention at higher rates of about 50 Å/sec or more with somewhat lower hydrogen content closer to about 6–8 at. % still exhibit superior device quality electrical characteristics and stability.

Figure 1:
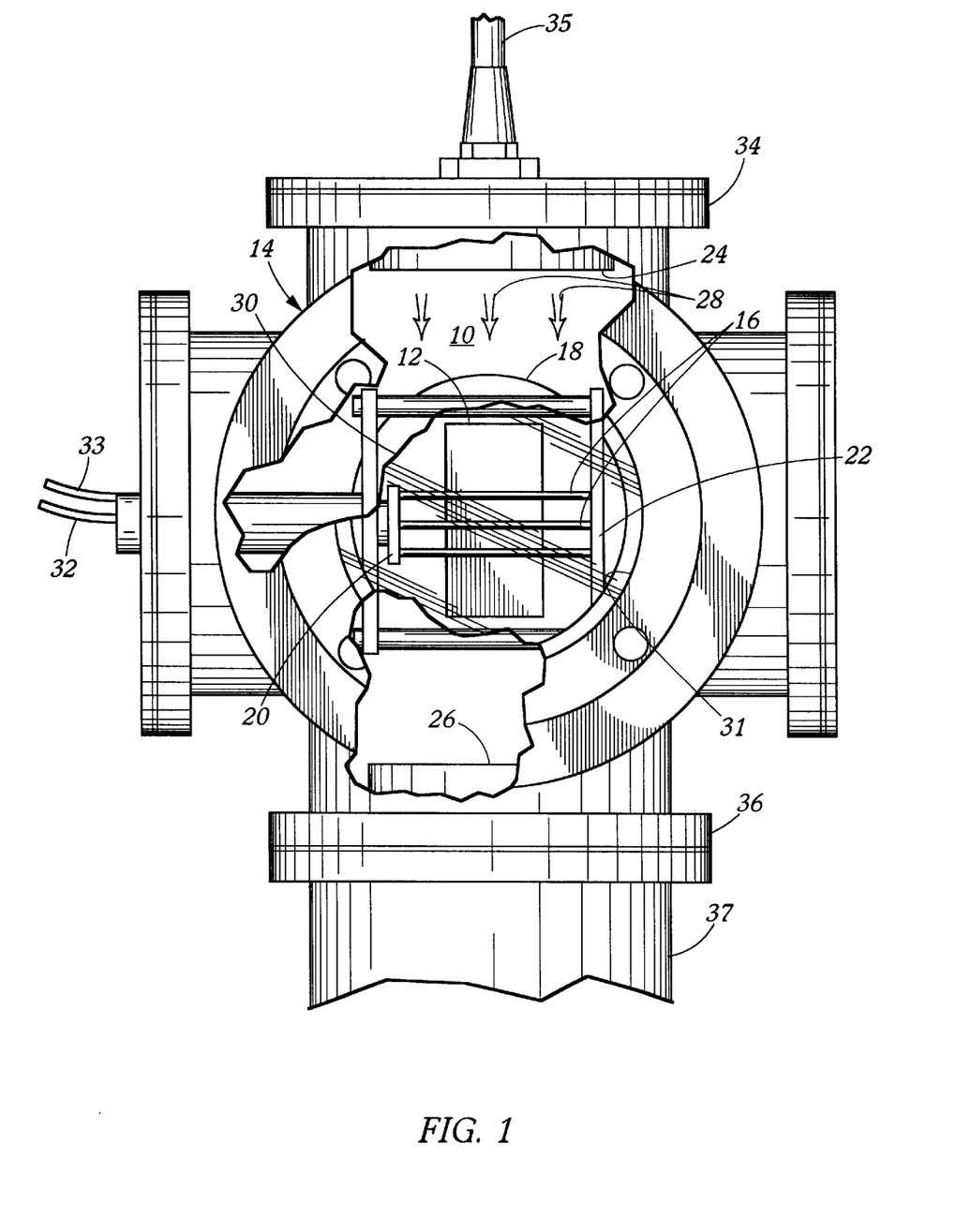
FIG. 1 is a top plan view of a hot filament chemical vapor deposition chamber suitable for producing the hydrogenated amorphous silicon film according to the principles of the present invention.

The hydrogenated amorphous silicon film may be produced at a high deposition rate according to this invention with any suitable apparatus as will be understood readily by persons skilled in the art upon gaining an understanding of the features of this invention. However, to facilitate the explanation of this invention, an example suitable apparatus is illustrated in FIG. 1. A typical vacuum deposition chamber 10 enclosed by a housing 14 is illustrated from a top plan view with a transparent window 30 mounted in the top flanged opening 31 and with portions of the housing 14 and window 30 broken away to show the operative components in the chamber 10. A substrate table or holder 18 is positioned in the chamber 10 to support a substrate 12 on which the hydrogenated amorphous silicon film is to be deposited. A heating element (not shown) can be provided under the substrate table 18, preferably outside the vacuum system, to heat the substrate 12 to the desired temperatures, which are described in more detail below. A plurality of wire filaments 16, preferably tungsten, are supported between two electrodes 20, 22 a spaced distance over the substrate holder 18, and electric power is supplied to the electrodes 20, 22 by wire leads 32, 33. Because the distance between the filament 16 and the substrate 12 is a critical factor of this embodiment of the invention and because that distance is not large, it is preferred that each filament 16 be a straight, rather than coiled, wire configuration so that the distance between the filaments 16 and the substrate 12 does not vary over the width of the substrate 12. For uniform deposition on a larger substrate surface, a plurality of filaments 16 are preferred, as illustrated diagrammatically in FIGS. 1 and 2, although the principles of this invention are also applicable to deposition with only one wire filament 16 and with other filament configurations, such as coils (not shown) or zig-zag and stretched coils (not shown). When such a plurality of filaments 16 are used, it is preferred that the distance M between filaments 16 be about the same as the distance L between the filament 16 and the substrate 12 as illustrated diagrammatically in FIG. 2. Referring again to FIG. 1, a gas inlet 24 mounted in flange 34 is connected by a conduit 35 to a feed gas source (not shown), and an outlet port 26 mounted in the diametrically opposite flange 36 is connected by a conduit 37 to a vacuum pump (not shown).

In operation, the substrate 12 is placed on support table 18, and the chamber 10 is sealed. The vacuum pump (not shown) is turned on, and the chamber 10 is evacuated. A silicohydride gas, as will be described in more detail below, is made to flow into the chamber 10 through tube 35 and inlet 24, as indicated by arrows 28. The silicohydride gas flows across chamber 10 preferably transverse to the filaments 16. When electric power is applied to the filaments 16, the filaments 16 get very hot, and the silicohydride gas is absorbed onto the surfaces of the hot filaments 16 similar to a catalytic converter, where the silicohydride gas is decomposed and re-evaporated substantially in the form of its atomic species—silicon (Si) and hydrogen (H). The silicon and hydrogen atoms then react with other silicohydride gas molecules to form radicals, which are then deposited onto the substrate, as will be described in more detail below.

There are four important identified deposition parameters that have to be optimized to produce good device quality films of hydrogenated amorphous silicon (a-Si:H), according to this invention. These four parameters, all of which have to be coordinated and kept within the preferred ranges, include filament temperature ($T_{FIL}$), silicohydride gas pressure (P) in the chamber, distance (L) between filament and substrate, and substrate temperature ($T_{SUB}$), as will be described in more detail below. As will also be described in more detail below, the gas pressure (P) and the distance (L) between the filament and the substrate are preferably maintained within a balanced relationship defined by the mathematical product of these two parameters i.e., by multiplying the pressure P times the distance L (P×L).

The filament temperature at which the decomposition of the silicohydride gas begins will vary somewhat, depending on the specific silicohydride gas used, such as, for example, silane, disilane, or other gases or combinations of gases containing silicon and hydrogen. The preferred silicohydride gas is concentrated, high purity silane ($SiH_4$) from a resultant process and device quality perspective. Hydrogen-diluted silicohydride gas may also be used. The filament 16 temperature should be at least 1,500° C. and preferably about 2,000° C. (±200° C.). That temperature provides the most efficient and effective decomposition of the silane gas to its constituent elements—silicon (Si) and hydrogen (H). It also prevents build-up of Si atoms on the filaments 16, which modifies the deposition behavior and shortens the filament 16 life time. The flow of silane at a rate in the range of 10–100 sccm, preferably about 50 sccm (±20 sccm) for a 4-inch diameter chamber, can be regulated by a flow controller and is pumped through the chamber by means of a turbo-molecular pump (not shown). The temperatures at the ends of the filaments 16 are usually not as high as the temperatures in the centers of filaments 16, and, where such end temperatures are less than 1,500° C., such as around 1,400° C., the silicon and possibly even the hydrogen, tend to alloy at those outer ends, which is an undesirable effect that should be kept to a minimum for the purposes of this invention.

Figure 2:
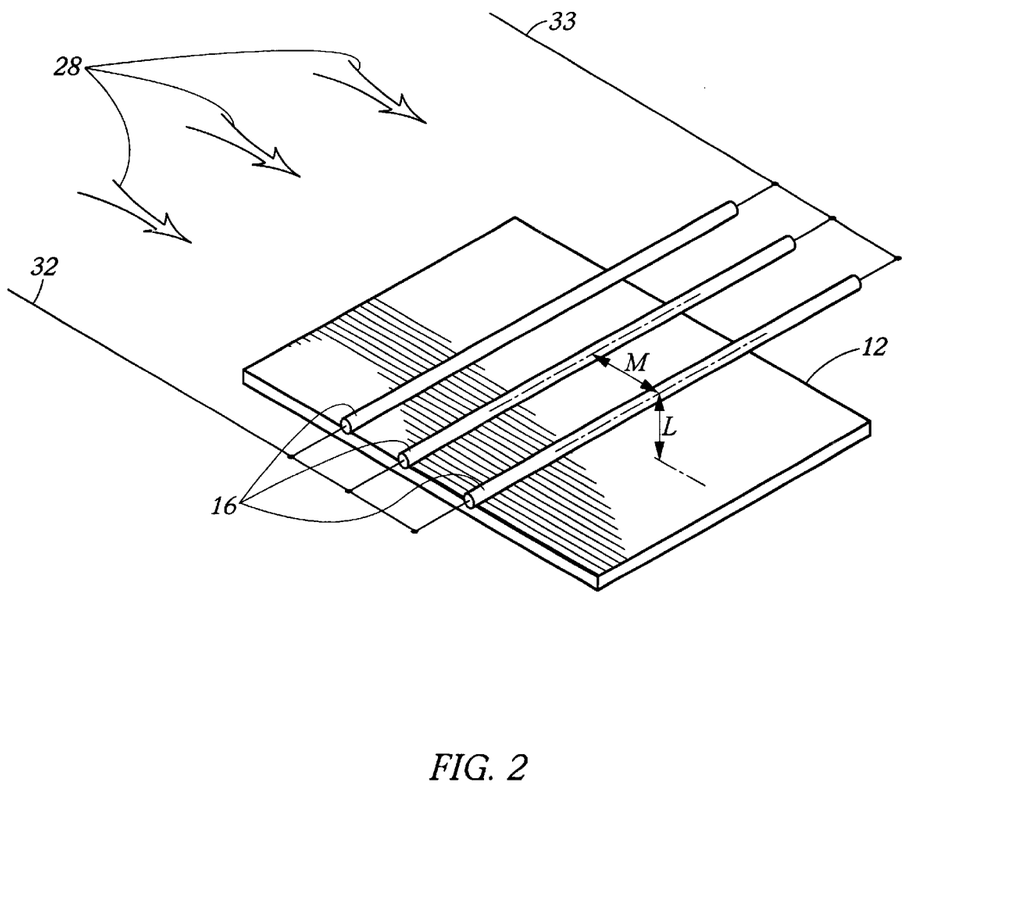
FIG. 2 is a diagrammatic isometric view of a multi-filament deposition rate apparatus for coating layer substrate areas according to this invention.

The second and third parameters, chamber pressure (P) and distance (L) between each filament 16 and substrate 12 are very interrelated. In the early research on amorphous silicon deposition using the hot wire (HW) filament technique, it was found that, as the decomposed silicon and hydrogen atomic species are evaporated off the hot filament 16 and migrate toward the substrate 12, some collisions occur among the silicon and hydrogen atoms and the undecomposed $SiH_4$ gas molecules due to normal Brownian movements. A few of these collisions were found to be necessary, according to this invention, to produce a good, device quality, hydrogenated amorphous silicon film. As will be explained below, certain gas precursors must be reacted away in order to produce device quality films according to this invention, and the probability of this reaction occurring becomes higher as the number of gas phase collisions increases. However, according to this invention, both too few collisions and too many collisions are deleterious to the quality of the resulting a-Si:H film. The number of atomic collisions is a function of the gas pressure (P) in chamber 10 and of the distance L between the filaments 16 and the substrate 12, so those parameters have to be controlled carefully. It has been found, according to this invention, that, when using concentrated silane and a single filament, a pressure in the range of about 5 to 50 millitorr (preferably about 30 millitorr (±5 millitorr)) and a distance between the filament 16 and substrate 12 in the range of about 0.5 to 2.0 cm (preferably about 1.0 or 1.5 cm) produces the a-Si:H film with excellent electrical characteristics and stability, i.e., device quality, at exceptionally high deposition rates in the range of about 50 Å/sec or more in the vicinity immediately adjacent the hot wire filament 16. On portions of the substrate 12 that are farther away from such a single hot wire filament 16, the deposition rate is less, of course, but is still observed to be at least 15 Å/sec on areas of the substrate 12 that are remote from the hot wire filament 16. In order to coat uniformly a large area substrate 12 with device quality a-Si:H film, an array of equally spaced filaments 16 separated from each other by a distance M that is about the same as the filament 16 to substrate 12 gap or distance L, as illustrated in FIG. 2, is preferred. For such an array, the product of the gap or distance L times pressure P (P×L) will be slightly larger than the single filament value of about 30 millitorr-cm. At this preferred pressure times gap (P×L) product value, an average number of about 10 atomic collisions between the atomic species (Si, H) and the silicohydride gas occurs as the atoms migrate from the filament 16 to the substrate 12. As mentioned above, this relationship according to this invention produces the best results for high rate deposition of device quality a-Si:H, since it ensures that almost all of the Si atoms react with silicohydride gas molecules before reaching the film, while avoiding excessive numbers of deleterious radical-radical collisions that will occur at larger values of the pressure times gap or distance (P×L) product. Under these conditions, a pressure in the range 10–300 millitorr (preferably about 30–200 mT) and a distance between the filament 16 and the substrate 12 in the range of 1.0 to 5.0 cm (preferably about 3.0 cm (±0.5 cm)) are used. This arrangement produces an a-Si:H film with excellent electrical characteristics and stability in the range of 50–150 Å/sec or more.

Figure 3:
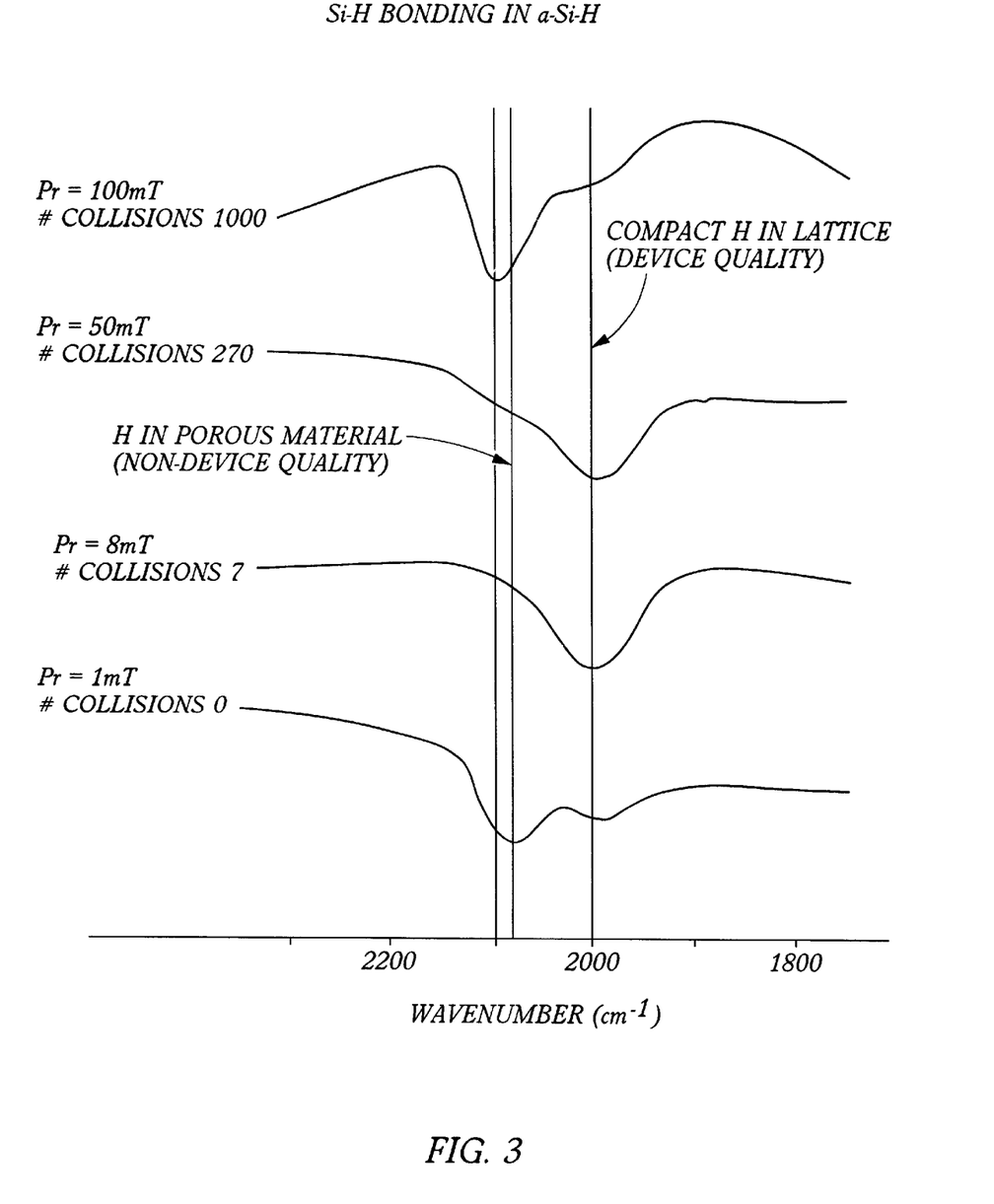
FIG. 3 is a graph that shows the type of Si—H bonding versus the approximate number of collisions the atomic species evaporated from the 2000° C. filament undergo as they traverse the filament to substrate distance in the deposition chamber and illustrates the parameters that produce device quality a-Si:H according to this invention.

The graphs in FIG. 3 show infrared absorption data illustrating the types of Si—H bonding occurring in an a-Si:H film versus the approximate number of gas collisions that the atomic species evaporated from the 2000° C. filament undergo as they traverse the filament-substrate distance in the deposition chamber. The graphs are offset vertically to show differences in curve shapes. It is known in the field that a dip in the transmission curve between 1950 and 2050 $cm^{-1}$ and centered in the neighborhood of 2000 wave numbers is the signature of H bonded in the monohydride, or SiH mode. This characteristic is indicative of H bonded in a compact Si lattice, and it is observed traditionally in device quality a-Si:H. It is also known that a dip in the transmission curve in the 2015–2150 $cm^{-1}$ region and centered in the neighborhood of 2070–2100 wave numbers can be the signature of H bonded polyhydride, or $(SiH_2)_n$ mode, which is indicative of H bonded in a porous lattice and is observed traditionally in non-device quality a-Si:H. As can be seen in FIG. 3, when the number of collisions is either too few or too many, the polyhydride signature is clearly evident. It is only when the number of collisions are limited, i.e., in the neighborhood of 10 as discussed in this invention, that device quality a-Si:H is produced.

and $(SiH_2)_n$ and (SiH) refer to the amount of film absorption in the infrared modes centered at approximately 2070–2090 $cm^{-1}$ and 2000 $cm^{-1}$ respectively. The lower the ratio R', the more dense and superior the electrical characteristics will be and the film will be more stable.

While it is not entirely clear at this point exactly why these pressure and distance parameters produce the best device quality hydrogenated amorphous silicon films, it is now believed that the number of atomic collisions that the pure atomic species undergo in the gas phase is important in the sense that the probability that these atomic species will react with the unreacted silane molecules, thus change their form, increases with the number of atomic collisions. More specifically, when silane ($SiH_4$) molecules reach a hot filament 16, they disassociate into either free atomic species such as silicon (Si) atoms and free hydrogen (H) atoms or some variation, for example, including hydrogen gas molecules ($H_2$). The free silicon (Si) atoms which evaporate from the filament 16 have four unsatisfied bonds, thus are very reactive. If they reach the substrate in that reactive form, they will stick to the growing film wherever they land rather than diffusing around the surface to find the best sites for lowest energy positions before bonding. As a result, such free Si atomic species that reach the substrate would contribute toward the production of more porous films that have less desirable structures and poor electronic properties. The specie $SiH_3$, however, has only one unreacted bond and is thus far less reactive. This less reactive specie ($SiH_3$), upon reaching the substrate, is more mobile and free to diffuse and move around on the growing film surface to find the most desirable, lowest energy sites before bonding. The result is a film with better structure, fewer dangling bonds, and better electrical properties. Therefore, if the Si atomic species that are evaporated from the hot filament 16 can be prevented from reaching the substrate 12 or growing film, thus allowing the a-Si:H film to be grown from less reactive species, such as $SiH_3$, the resulting structure and electronic properties of the a-Si:H film will be much better.

Consequently, it is important, according to this invention, to create processing conditions that minimize the probability of free Si atoms from reaching the substrate 12 or the growing film surface in favor of less reactive species, such as $SiH_3$. Such processing conditions are created, according to this invention, by providing parameters that encourage an optimum probability of reacting away free Si atomic species evaporated from the hot wire filament 16 before they reach the substrate 12 or growing film surface as well as by reacting free H atoms evaporated from the hot wire filament 16 with silane ($SiH_4$) molecules to produce some of the less reactive species, such as $SiH_3$ and $SiH_2$. All of the possible reactions are not known or understood completely, but, for example, a free Si atom might react with a $SiH_4$ molecule to produce two $SiH_2$ molecules or a $SiH_3$ molecule and a SiH molecule, the latter of which may possibly react with one or two hydrogen atoms to produce a $SiH_2$ molecule or a $SiH_3$ molecule. Similarly, a free H atom might react with a $SiH_4$ molecule to produce a SiH molecule and a $H_2$ gas molecule. However, all of these and other possible reactions to eliminate free Si atoms and to produce the less reactive, thus more desirable, $SiH_3$ molecular species, require contacts, i.e., collisions, between the disassociated Si or H atomic species that are evaporated off the hot wire filament 16 and the unreacted $SiH_4$ molecules from the feed gas. There is not necessarily a reaction for every collision, but there is a probability that a collision will result in a reaction. The probability of a disassociated H atom reacting with an unreacted $SiH_4$ molecule upon collision is not 100 percent, but it is quite high, and it is greater than the probability that a disassociated Si atom will react with an unreacted $SiH_4$ molecule upon collision. Overall, therefore, the higher the collision rate, the more likely it will be that the disassociated Si atoms evaporated off the hot wire filament 16 will be reacted with $SiH_4$ molecules before reaching the growing film on the substrate 12. Therefore, according to this invention, the chamber pressure (P) must be high enough to react away these Si atoms in the gas phase before they reach the growing film on the substrate 12.

On the other hand, when the chamber pressure (P) is too high, the probability of radical-radical reactions increases above a negligible level. When the Si atoms react with the silicohydride gas, some radicals containing 2-Si-atoms are produced, while H atoms reacting with the silicohydride gas produces $SiH_3$. If these radical species react with reach other in the gas phase, their products react with the silicohydride gas to yield multiple-Si-atom species, or, as this reaction continues, the process ultimately produces very small microparticles. For example, but not for limitation, two of the $SiH_3$ radicals or species could react together to form $Si_2H_x$ radicals (X>3), which in turn react with two or more $SiH_4$ molecules to yield larger $Si_xH_m$ radicals, with X, M>3. This heavy molecule moves less rapidly out of the chamber, thereby allowing it to react further with radicals and enabling it to gain even more Si atoms. Ultimately, hundreds of thousands of Si atoms combine in a microparticle that can deposit into the growing film with undesirable consequences for both electrical properties and structural properties. There are, of course, many other possible and probable radical-radical reaction combinations and resulting large silicon-hydrogen molecules that lead to microparticles. If such microparticles become incorporated into the growing film, they also have a deleterious effect on the film structure and on the electronic properties of the film. Therefore, it is necessary for purposes of this invention to maintain a proper balance between (i) too few collisions where too much Si reaches the growing film on the substrate 12 without reacting with the $SiH_4$ or other silicohydride feed gas (ii) and too many collisions where there are too many radical-radical reactions and microparticles forming.

Figure 4:
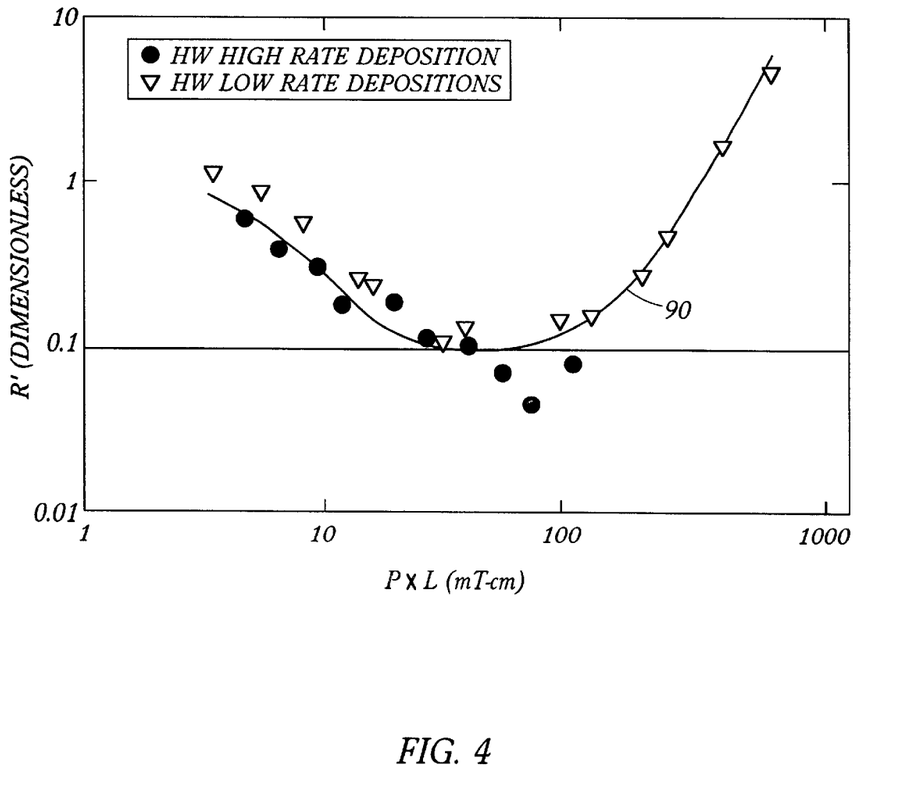
FIG. 4 is a graph of the infrared parameter R' versus the product of the chamber pressure (in millitorr) and the filament-to-substrate spacing (in cm) for both high and low rate depositions.

Experiments have shown that about 30 millitorr pressure when using concentrated silane gas in combination with a spacing of about 1.5 cm between a single hot wire filament 16 and the substrate 12 will produce excellent device quality hydrogenated amorphous silicon films at rates up to at least 50 Å/sec. This result was achieved as a result of discovering the relationship between R' and the P×L product that is illustrated in FIG. 4. As discussed above, the ratio R' is indicative of the a-S i:H film material and electrical quality. A lower R' number indicates fewer "wrong" bonds, thus more dense material with superior electrical device characteristics. As shown by the curve 90 in FIG. 4, there is a low R' value that corresponds with a particular P×L product. The curve 90 illustrated in FIG. 4, is constructed from a composite of data points for a P×L product <50 from films produced at both low and high deposition rates and for a P×L product >50 exclusively from low deposition rate data. As can be seen a low R' of about 0.1 is achieved at low deposition rates with a P×L product of about 45 mT-cm, while at high deposition rates an R' of <0.1 is achieved for a P×L product of >60 mT-cm and may extend to values higher than shown on FIG. 4. The significance of discovering this relationship between R' and the P×L product according to this invention is that, for a desired filament-to-substrate spacing L, the optimum pressure P to produce a low ratio R', thus high quality film, according to this invention, can be determined. The result is that a high electric quality film can be produced, even at the high deposition rates of 50 Å/sec. or more, by maintaining the pressure (P) and the filament-to-substrate spacing (L) within a relationship where the P×L product is in the range of about 10 to 300 mT-cm, preferably about 30–200 mT-cm (about meaning ±5 mT-cm). In the example described below for a single filament, the 30 mT pressure times 1.5 cm filament-to-substrate spacing provides a P×L product of 45 mT-cm, which, as illustrated by the graph in FIG. 4, has a minimum R' value of about 0.1. A 1.0 cm filament-substrate spacing would require about 45 mT pressure according to this invention in order to maintain the P×L product at about 45 mT-cm where R' is at the minimum. When using an array of filaments 16 to produce deposition rates in the range 50–150 Å/sec. or more, while the optimum P×L value is higher than the value of 45 mT-cm previously discussed (the optimum P—L values for multiple filaments 16 in the range of 30–200 mT-cm), the same trends observed in FIG. 4 are still in evidence. That is, both above and below the optimum values, R' is observed to increase. For all of the sample high deposition films whose properties will be discussed below, R' is $\leq 0.1$, i.e., at or below the minimum value seen in FIG. 4.

The fourth parameter, the substrate temperature ($T_{SUB}$), is also a controlling factor in the quantity of hydrogen finally incorporated into the hydrogenated amorphous silicon film. The typical relationship between substrate temperature and hydrogen content is that the higher the substrate temperature, the lower the hydrogen content of the hydrogenated amorphous silicon (a-Si:H) film. However, the film growth rate also influences the H content. Experiments that lead to the development of this invention indicate that for constant growth rate, the hydrogen H content decreases monotonically as the temperature of the substrate 12 increases, and for constant substrate temperature, increasing the growth rate increases the H content. Consequently, it has been found that, as used in this invention with the other parameters described above, the temperature of the substrate 12 should be maintained in the range of 200 to 600° C., and preferably at about 350–500° C., during the deposition process with the optimum value within that range depending on growth rate. Heating the substrate table or holder 18 to the temperature of about 400 to 600° C. actually results in slightly lower temperatures in the range of about 300 to 500° C. at the substrate surface due to the high vacuum, infrared radiation from the substrate surface, and other thermal conduction inhibitions. Slightly lower optimum temperatures can be used (200–300° C.) when hydrogen ($H_2$) dilution of the silane gas is used.

One additional factor has been identified, which might contribute to allowing a superior a-Si:H film to be produced with such low H content according to this invention. As opposed to the glow discharge process, which involves very energetic electrons, neutral radical species, and, the maximum kinetic energies obtainable in the process of the present invention are the thermal energies that the atomic species receive as they are evaporated off the substrate. In addition, since these species undergo several collisions in the gas phase, the energies of the mix of radical species in the deposition chamber is reduced even further. Therefore, at these low thermal energies, no ions or energetic electrons are produced in the gas phase. Since it is generally believed that film bombardment by energetic species damages the growing film surface, films grown by the present technique may avoid the effects of such bombardment.

It had generally been believed, prior to our invention described in our U.S. Pat. No. 5,397,737, that the "normal" hydrogen content of about 10–15 at. % in amorphous silicon films was needed to passivate Si dangling bonds and reduce lattice strain in the amorphous silicon. The method of that invention, however, allowed the deposition of lower than "normal" hydrogen content hydrogenated amorphous silicon (a-Si:H) with reduced randomness of the deposited silicon, thus with reduced lattice strain between the silicon atoms within the film.

It has also been believed prior to this invention that the deposition of hydrogenated amorphous silicon at significantly higher rates, compared to rates used in prior art manufacturing processes, results in films that display increased amounts of "wrong bonded hydrogen," i.e., an increase in the ratio R', a deterioration in electronic properties, and an increase in the degradation of photovoltaic cells fabricated with such films upon exposure to sunlight. This degrading effect, as mentioned above, is called the Staebler-Wronski effect. The method of this invention, however, allows the deposition of hydrogenated amorphous silicon at significantly higher deposition rates in films that exhibit no increase in the amount of "wrong bonded hydrogen," a preservation of device quality electronic properties, and a Staebler-Wronski effect equal to or better than that exhibited by films that are deposited by the prior art glow discharge (GD) methods at significantly lower deposition rates.

EXAMPLE I

A sample of hydrogenated amorphous silicon film with very good electronic properties was made at a very high deposition rate—114 Å/sec—according to the high deposition rate method of this invention. To achieve this high deposition rate, pure silane gas ($SiH_4$) was flowed at the rate of about seventy-five atmospheric-pressure cubic centimeters per minute (75 SCCM (±5 SCCM)) into the chamber, which was maintained at about a 50 mT (±5 mT) pressure (P). The substrate 12 was positioned 3.2 cm from parallel filaments 16 for a P×L product of about 160 mT-cm. The 50 mT pressure and substrate-filament spacing, i.e., P×L product of about 160 mT-cm, ensured that most of the Si evaporated from the hot filament 16 reacted with $SiH_4$ molecules before reaching the substrate 12 and provided a minimum in the R'-value (R'≈0.10) as determined from infrared (IR) spectroscopy. This R' value is equal to the lowest value measures in device quality films deposited by prior art techniques. The substrate surface temperature was estimated to be about 440° C. (±10° C.) based on an internal thermocouple touching the substrate holder. The filaments 16 used were 0.5 mm diameter, 10 cm long tungsten filaments, which were heated with AC current of 15 amps to about 2,000° C. The deposition rate on this sample was 114 Å/sec. The hydrogen content of the resulting hydrogenated amorphous silicon film was measured to be about 7 at. % (about meaning ±1 at. %). The initial midgap density of states (DOS) in the as-grown state was measured by both by Constant Photocurrent Measurement Technique (CPM) and capacitance to be about $1.7 \times 10^{16}$ $cm^{-3}$, and the value in the light soaked state, measured after 120 hour exposure to 2 $W/cm^3$ AM 1.5 light, is between $2.2 \times 10^{16} cm^{-3}$ and $4.0 \times 10^{16}$ $cm^{-3}$.

Presented below is a description of the properties of hydrogenated amorphous silicon films produced according to the high rate deposition method of this invention, as a function of measuring film deposition rate. The use of hot wire or filament 16 to assist a vapor deposition, as in the current invention, is commonly referred to as a hot-wire-assisted chemical vapor deposition or hot wire (HW) deposition. It is to be understood that the examples given below are for illustrative purposes only, and are not intended to limit the scope of the invention as herein described or as set forth in the appended claims. Where possible, we distinguish between films deposited with one filament and two filaments, and we also compare the present results to: (i) a deposition of a low hydrogen content, hydrogenated amorphous silicon film produced according to the embodiment of the invention as it was described in our U.S. Pat. No. 5,397,737; and (ii) films deposited by other deposition techniques. However, few other deposition processes are capable of high deposition rate methods, especially for device quality films, so our attempts at comparisons to films deposited by other techniques are incomplete at best, particularly for deposition rates >50 Å/sec., because we are not aware of any other processes that are producing state-of-the-art device quality a-Si:H films at these rates.

Some hot wire (HW) films were deposited previously using the method of invention as described in U.S. Pat. No. 5,397,737 using silane gas, a deposition chamber pressure of 8 mT, a filament to substrate spacing of about 5 cm, and a filament temperature of about 2000° C. The deposition rates for these films, deposited according to the principles of the present invention were 5–10 Å/sec. While the substrate temperature was varied to change the atomic % of H contained within the various films, for comparison purposes, we show data from the films in Table I and in the graphs of FIGS. 5–8, which contain 6–8 at. % H, i.e., a hydrogen content similar to those films deposited at according to this invention 50–150 Å/sec.

TABLE I

| Sample # | Deposition rate Å/sec. | # of filam, spacing | $T_{sub}$ (° C.) | $P_{ch}$ (mT) | $SiH_4$ flow (sccm) | I(amp) per filam |
|---|---|---|---|---|---|---|
| L016 | 17  | 1/5   | 302 | 17 | 75 | 16 |
| L043 | 34  | 2/4   | 300 | 20 | 50 | 15 |
| L032 | 40  | 2/5   | 325 | 45 | 50 | 15 |
| L113 | 71  | 2/3.2 | 315 | 35 | 50 | 15 |
| L103 | 87  | 2/3.2 | 315 | 50 | 50 | 15 |
| L177 | 94  | 2/3.2 | 316 | 50 | 75 | 15 |
| L095 | 109 | 2/3.2 | 400 | 50 | 75 | 15 |
| L106 | 111 | 2/3.2 | 350 | 50 | 75 | 15 |
| L105 | 114 | 2/3.2 | 350 | 50 | 75 | 15 |
| L093 | 124 | 2/3.2 | 385 | 70 | 50 | 15 |
| L092 | 132 | 2/3.2 | 326 | 70 | 50 | 15 |
| L096 | 144 | 2/3.2 | 385 | 90 | 50 | 15 |

The hydrogen content of each of these previous samples in Table I were determined from the films deposited onto the crystalline silicon substrate by the magnitude of the absorption of the SiH 630 $cm^{-1}$ infrared mode. Film thickness for all samples were typically 1.5–2.5 µm, and Raman measurements showed all films to be amorphous.

Figure 5:
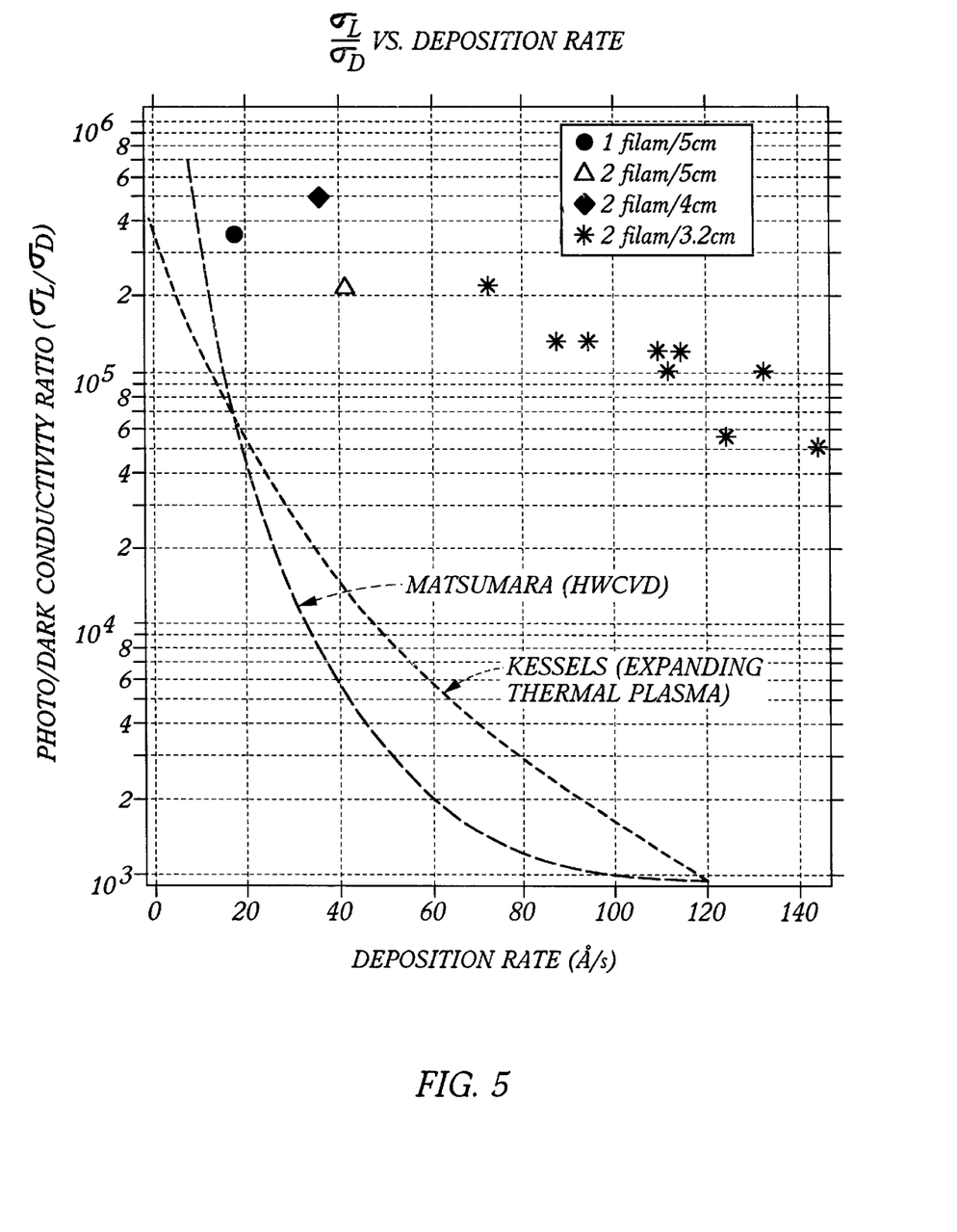
FIG. 5 shows the Photo divided by Dark Conductivity ratio versus the film deposition rate for hydrogenated amorphous silicon films containing about 6–8 at. % hydrogen produced with several different numbers of filaments used and filament-substrate spacing.

The Photo to Dark Conductivity ratios for the HW samples described in this present patent, are plotted in FIG. 5 against a linear scale of deposition rate in angstroms per second (Å/sec). The number of filaments used to make the depositions and the filament(s)-substrate spacings are also indicated. Also shown are data for films deposited using other deposition techniques, including the expanding thermal plasma (W. M. M. Kessels et al., Proc. 2000 MRS Spring Meeting, in press) and HW Techniques (H. Matsumura, International Pre-Workshop CAT-CVD (Hot Wire CVD) Process, September 1999, Ishikawa, Japan, Extended Abstract). It is well-known in the art that, when amorphous silicon deposited by any technique and at any deposition rate exhibits a light and dark conductivity ratio exceeding 100,000, such material is regarded as being device quality and that such material can be incorporated into state-of-the-art photovoltaic solar cells, thin film transistors, and other thin film device structures. As can be seen in FIG. 5, the HW samples that form the basis of the present invention exhibit a higher ratio than any of the other samples made with other techniques for which comparisons (at similar deposition rates) are possible.

Figure 6:
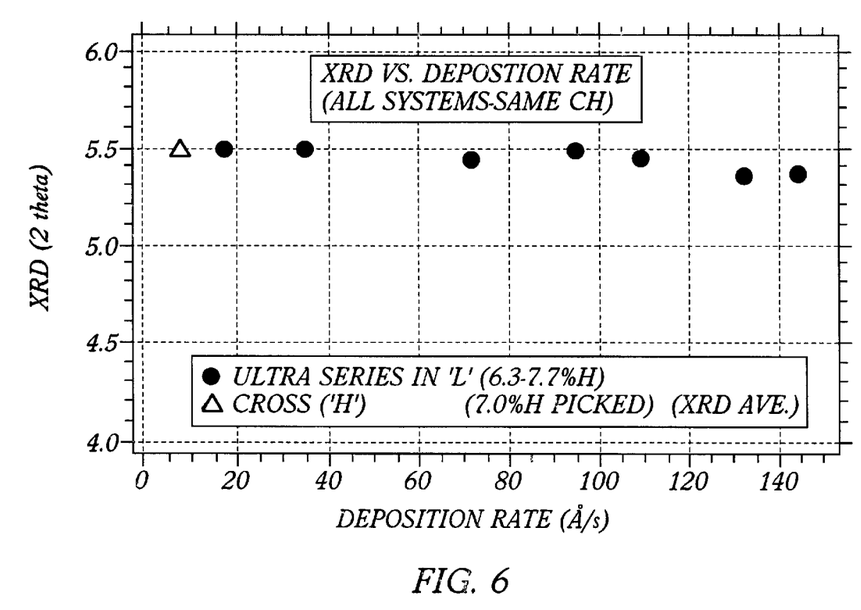
FIG. 6 is a graph of the full width at half maximum of the first X-ray diffraction (XRD) peak versus film deposition rate for hydrogenated amorphous silicon films produced according to this invention, wherein such diffraction peak occurs at a scattering angle (2Θ) of about 27.5° and its width is commonly used as a measure of (medium range) structural order (i.e., crystalline silicon (c-Si) films exhibiting a high degree of order have exceedingly narrow XRD widths while hydrogenated amorphous silicon (a-Si:H) film peak widths are much broader (>5°))
Figure 7:
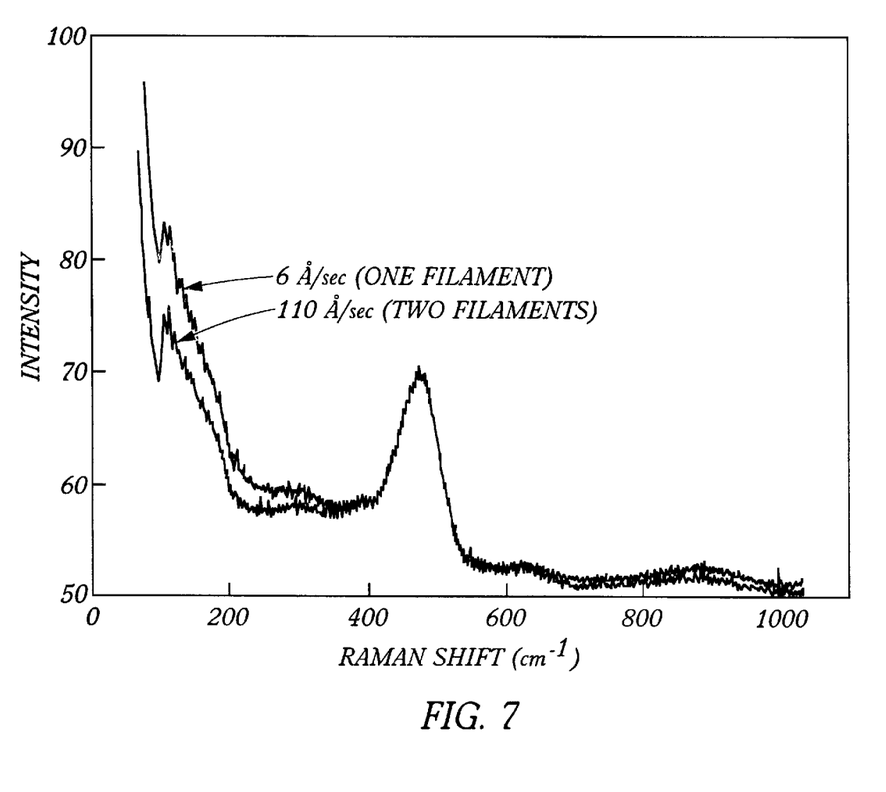
FIG. 7 is a graph of Raman scattering from two hydrogenated amorphous silicon films produced according to the principles of the present invention, one of which was deposited at 6 Å/sec using 1 filament and the other of which was deposited at 110 Å/sec using 2 filaments (the width of the Si—Si transverse optical node, located at a frequency of about 480 cm$^{-1}$, is routinely used as a measure of bond angle deviation, i.e., short range structural order)

A relevant issue relating to film electronic quality is the structural quality of hydrogenated amorphous silicon films. It is well-known in the field that the film structural quality and film electronic quality are very interrelated. For example, when the substrate deposition temperature is significantly lowered below acceptable values (i.e., <200–250° C.), the amount of dihydride bonded H in the film increases dramatically, and all structural indicators as well as electronic indicators get worse. It is therefore important to examine the structural quality of the high deposition rate, HW films produced according to this invention to, determine whether such quality is preserved as the deposition rate is increased from standard conditions (<10 Å/sec) to high deposition rate conditions (>100 Å/sec). In FIGS. 6 and 7, we show the results of such an examination. FIG. 6 is a graph of the full width at half maximum (FWHM) of the first XRD peak observed for samples of hydrogenated amorphous silicon films fabricated at eight different film deposition rates. The ULTRA series (solid circles) were two filaments for deposition rates >30 Å/sec., and the CROSS ('H') was one filament. In this field, since the FWHM for crystalline silicon is much narrower than the corresponding FWHM for hydrogenated amorphous silicon films, the width of the amorphous peak plotted in FIG. 6 is taken as an indicator of the amount of medium range structural order—the narrower the peak, the more medium range order exists in the material. As can be seen in FIG. 6, the medium range order for the hydrogenated amorphous silicon samples, which form the basis of this invention, is invariant versus deposition rate, which indicates no deterioration in structural order as the deposition rate is increased. Going further, FIG. 7 is a graph of Raman scattering from two of the hydrogenated amorphous silicon samples produced according to the principles of the present invention. Sample (530° C.-2/5/90) was deposited at a deposition rate of 6 Å/sec, while sample L179 was deposited at 110 Å/sec. At issue here is the half width at half maximum (HWHM) of the transverse optical Si—Si phase or mode, which has been related to the nearest neighbor bond angle deviation, thus is an accepted measure of short range ordering. As can be seen in FIG. 7, the short range order is also invariant with increasing deposition rate and is among the narrowest in the literature, which again indicates no deterioration in structural order with increasing deposition rate. For comparison purposes, we are not aware of any XRD on Raman data for high-deposition rate samples by other techniques with which comparison can be made.

It is important to note that the lowest deposition rate samples (<10 Å/sec) in FIGS. 6–7 have been extensively characterized both optically and electrically, and every measurement (Urbach edge, optical bandgap, ambipolar diffusion length, midgap defect density) made on these samples is consistent with state-of-the-art hydrogenated amorphous silicon material. These measurements are compiled in U.S. Pat. No. 5,397,737, which is incorporated herein by reference. As a result, the invariance of both the medium range and short range structural order with increasing deposition rates for the hydrogenated amorphous silicon samples, which form the basis of the present invention, is extremely suggestive that the optical and electronic properties of the film deposited at deposition rates at 50–150 Å/sec or more according to this invention will also exhibit state-of-the-art device quality.

Figure 8:
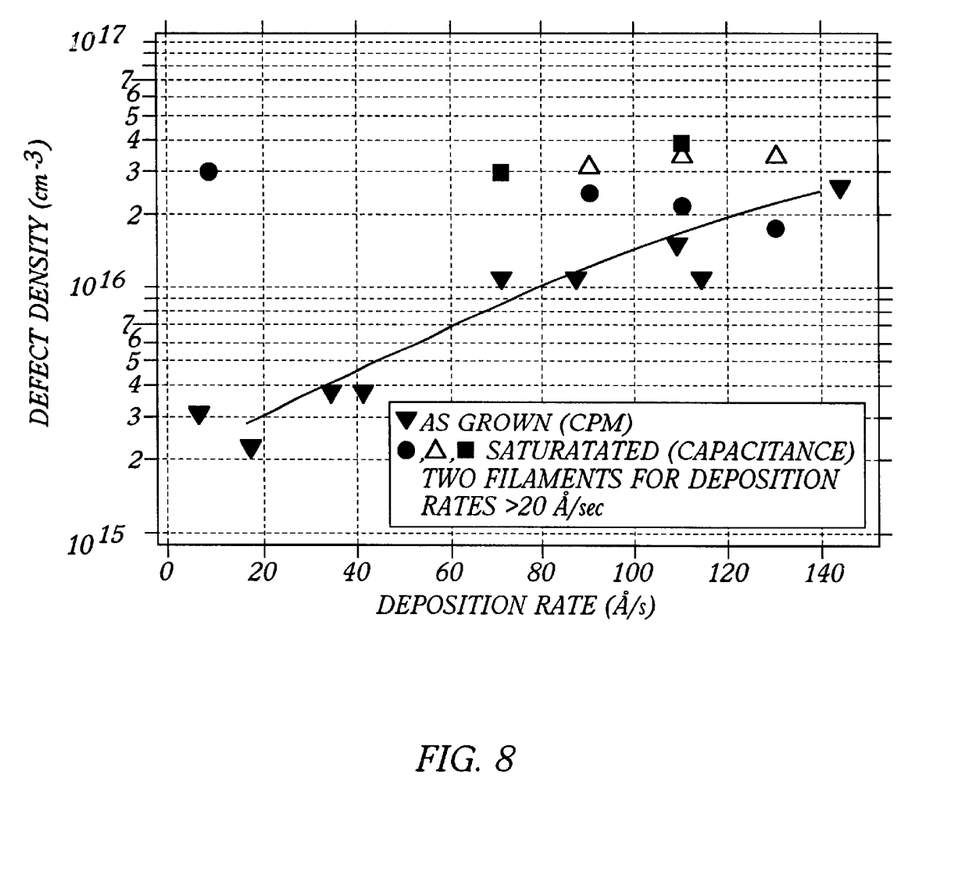
FIG. 8 is a graph of the midgap state defect density values versus deposition rate for hydrogenated amorphous silicon (a-Si:H) film produced according to the principles of the present invention. The as-grown values were obtained by the constant photo current (CPM) technique, while the light soaked (saturated) values for all samples were measured by capacitance techniques.

Accordingly, in FIG. 8 we show the midgap state defect density versus deposition rate for the hydrogenated amorphous silicon films produced according to the principles of the present invention. There are several accepted methods known in the field for measuring these defect densities, and they are used here. They are, respectively, known in the literature as the constant photocurrent (CPM) technique, and the drive level and photo capacitance spectroscopy techniques. In FIG. 8, the latter are indicated simply as capacitance techniques. As can be seen, while the defect density of the HW sample in the as-grown state does increase slightly with increasing deposition rate, the saturated, or light soaked, values are independent of the deposition rate for the samples which form the basis of this invention. This characteristic is crucial from the point of view of incorporating such high deposition rate films into commercially applicable device structures, such as photovoltaic solar cells or thin film transistors, because the saturated defect denities are those that determine device performance. Although the Staebler-Wronski effect (degredation of electrical quality due to prolonged exposure to sunlight) can be reversed in laboratory devices by annealing said devices to 150–200° C., such annealing is not practical for devices already in use in commercial applications. Therefore, the saturated defect densities eventually affect and determine the device behavior. In addition, we note that the saturated defect densities reported here for the high deposition rate HW samples are identical to those for very low deposition rate (1–5 Å/sec) GD samples that are currently being successfully deployed in a variety of industrial applications. Thus, based upon such a comparison, a-Si:H films of the present invention are as resistant to degradation in prolonged exposure to sunlight, i.e., resistant to the Stabler-Wroenski effect, as the best a-Si:H photo-cell material that is currently being produced commercially with other techniques, such as glow discharge (GD) at much slower rates, e.g., 1–5 Å/sec.

It is important to note in FIG. 8 the lack of comparison of the present results with those of other samples deposited by other techniques, particularly relating to the saturated defect densities. We are unaware of any saturated density results for samples deposited in excess of 20 Å/sec; this is due to a combination not only of the dirth of other techniques that can achieve such high [a-Si:H] a-Si:H deposition rates processes, but also due to lack of enough progress, let alone success, in any other high rate processes in this area to have electrical properties and values published in the open literature. In particular, the results of this invention represent the first measurements of which we are aware of saturated defect densities for high deposition rate hydrogenated amorphous silicon samples deposited by any technique.

In summary, the measurements presented in FIGS. 5–8 suggest that the high deposition rate HW films and the process, which form the basis of the present invention, are of sufficient device quality to consider their incorporation into today's commercial applications, and that no other deposition technique currently produces films of the present quality at deposition rates in the range of 50–150 Å/sec or more. The Photo to Dark Conductivity ratio is higher than that reported for films deposited by any other competing process. The structural integrity of the films remains invariant as the deposition rate is increased through the range from 5 to about 150 Å/sec. Although the initial defect state density does increase with increasing deposition rate, the saturated or light soaked value remains invariant over this range of deposition rates. Accordingly, the process of this invention demonstrates high rate, large area deposition of device quality, hydrogenated amorphous silicon films, particularly when using concentrated silane.

Based on observations and information learned from this invention, use of even higher pressures in combination with closer substrate-to-filament spacing and use of more than two filaments, such as 1.0 to 2.0 cm spacing with 70–150 mT pressure for 3–4 filaments, will produce even higher deposition rates while retaining the good to excellent electronic properties achieved in the examples described above. Again, the important criteria are that the filament 16 temperature be high enough (about 2000° C. (±200° C.)) to obtain complete decomposition of the impinging silicohydride gas, a combination of pressure (P) and substrate to filament spacing (L) that ensures that most (more than fifty (50) percent, preferably more than ninety (90) percent) of the Si evaporated from the filaments 16 can react with $SiH_4$ or other silicohydride molecules before reaching the substrate 12, and that substrate 16 temperature be in a range (about 200–600° C.) that balances out-diffusion of hydrogen from the growing a-Si:H film with time needed for $SiH_3$ molecules to migrate to preferred bonding sites in view of the high rate at which Si and hydrogen-containing radicals arrive and bond at the substrate 12. In other words, heat energy imparted to hydrogen atoms deposited on the substrate 12 or on the a-Si:H film growing on the substrate 12 provides enough kinetic energy to keep the $SiH^3$ molecules on in the a-Si:H film sample sufficiently mobile to enable migration of the these $SiH^3$ molecules to lowest energy bonding sites in the film as the film grows and creates such sites, but not so much kinetic energy as to evaporate so much H out of the a-Si:H film as to leave enough unpassivated defect sites to prevent the a-Si:H film from being device quality.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to falling within the scope of the invention as defined by the claims which follow.

The embodiments of the invention in which an exclusive property or privilege is claimed are defined as follows:

1. A method of fabricating device quality, thin-film a-Si:H for use as semiconductor material in photovoltaic and other devices, comprising in any order:

positioning a substrate in a vacuum chamber adjacent a plurality of heatable filaments with a spacing distance L between the substrate and the filaments;

heating the filaments to a temperature that is high enough to obtain complete decomposition of silicohydride molecules that impinge said filaments into Si and H atomic species;

providing a flow of silicohydride gas, or a mixture of silicohydride gas containing Si and H, in said vacuum chamber while maintaining a pressure P of said gas in said chamber, which, in combination with said spacing distance L, provides a P×L product in range of 10–300 mT-cm to ensure that most of the Si atomic species react with silicohydride molecules in the gas before reaching the substrate, to thereby grow a a-Si:H film at a rate of at least 50 Å/sec.; and maintaining the substrate at a temperature that balances out-diffusion of H from the growing a-Si:H film time needed for radical species containing Si and H to migrate to preferred bonding sites.

2. The method of claim 1, including setting each of said filaments at said spacing distance from said substrate.

3. The method of claim 1, wherein said flow of silicohydride gas, or mixture of silicohydride gas containing Si and H, includes silane ($SiH_4$) and $H_2$.

4. The method of claim 1, including spacing the filaments apart from each other at about the same distance as said spacing distance between the substrate and the filaments.

* * * * *

UNITED STATES PATENT AND TRADEMARK OFFICE
CERTIFICATE OF CORRECTION

PATENT NO. : 6,468,885 B1
DATED : October 22, 2002
INVENTOR(S) : Archie Harvin Mahan et al.

It is certified that error appears in the above-identified patent and that said Letters Patent is hereby corrected as shown below:

Column 8,
Line 63, insert the following:
-- a good indication of the material quality is the ratio R', where:

$$R' = \frac{(SiH_2)_n}{(SiH)}$$

--

Column 16,
Line 55, after "a-Si:H film" insert -- with --.

Signed and Sealed this

Eleventh Day of March, 2003

JAMES E. ROGAN
*Director of the United States Patent and Trademark Office*